United States Patent [19]
Tanizawa et al.

[11] Patent Number: 4,564,773
[45] Date of Patent: Jan. 14, 1986

[54] SEMICONDUCTOR GATE ARRAY DEVICE HAVING AN IMPROVED INTERCONNECTION STRUCTURE

[75] Inventors: Tetsu Tanizawa; Hitoshi Omichi, both of Kawasaki; Yoshiharu Mitono, Tokyo, all of Japan

[73] Assignee: Fujitsu Limited, Kawasaki, Japan

[21] Appl. No.: 407,148

[22] Filed: Aug. 11, 1982

[30] Foreign Application Priority Data

Aug. 13, 1981 [JP] Japan .................. 56-127072

[51] Int. Cl.$^4$ ............... H03K 19/177; H03K 19/003; H03K 19/088; H01L 27/00
[52] U.S. Cl. ..................... 307/445; 307/465; 307/466; 307/303; 307/456; 357/45; 364/491
[58] Field of Search ......... 364/488, 490, 491; 365/63, 72; 357/45; 307/440, 443, 445, 465, 466, 467, 456–458, 303

[56] References Cited

U.S. PATENT DOCUMENTS

| | | | |
|---|---|---|---|
| 3,638,202 | 1/1972 | Schroeder | 365/72 |
| 3,912,914 | 10/1975 | Moylan . | |
| 3,999,214 | 12/1976 | Cass | 357/45 |
| 4,295,149 | 10/1981 | Balyoz et al. | 357/45 |
| 4,377,849 | 3/1983 | Finger | 307/303 |
| 4,412,240 | 10/1983 | Kikuchi et al. | 357/45 |
| 4,484,292 | 11/1984 | Hong et al. | 364/491 |

FOREIGN PATENT DOCUMENTS 0021836 2/1982 Japan .................. 357/45

OTHER PUBLICATIONS

Armstrong, "Applying CAD to Gate Arrays Speeds 32-Bit Minicomputer Design"; *Electronics*, pp. 167–173; 1/13/1981.
Dansky et al., "Custom Programmable Logic Arrays on STL Masterslices"; *IBM Tech. Discl. Bull.*; vol. 21, No. 4, pp. 1456–1460; 9/1978.
Electro/81 Conference Record, "A Family of CMOS Arrays with TTL Performance", Goldsmith, vol. 6, Apr. 7–9, 1981, pp. 1–6.
IBM Journal of Research & Development, "Bipolar Circuit Design for a 5000-Circuit VLSI Gate Array", Dansky, vol. 25, No. 2/3, May 1981, pp. 116–125.
Electro/80 Conference Record, "Using MECL 10K Macrocell Array as a Basic Building Block for Standard Product Development", King, vol. 5, May 13–15, 1980, pp. 1–7.
IEEE Spectrum, "Automating Chip Layout", Trimberger, vol. 19, No. 6, Jun. 1982, pp. 38–45.

*Primary Examiner*—Larry N. Anagnos
*Attorney, Agent, or Firm*—Staas & Halsey

[57] ABSTRACT

In a semiconductor device having a gate array structure, a macro-cell includes more basic cells than conventional macro-cells, for preforming a logic function, whereby the density of the terminals in a direction vertical to a direction in which wiring lines are drawn, is decreased.

3 Claims, 7 Drawing Figures

SEMICONDUCTOR GATE ARRAY DEVICE HAVING AN IMPROVED INTERCONNECTION STRUCTURE

BACKGROUND OF THE INVENTION

The present invention relates to a semiconductor device having a gate array structure in which a macro-cell is formed by a plurality of basic cells.

Generally, as a method of manufacturing a large-scale integration circuit (LSI), a gate array method is adapted for the purpose of shortening the manufacturing period.

In this method, a large number of logic gates are previously formed in a matrix fashion on a semiconductor chip, and when an order is received, electrode wirings are connected in order to complete the required logic circuit on the semiconductor chip. The wiring pattern is usually designed by a digital computer and determined by means of a grid method in which wiring routes can be selected only on lines running lengthwise and laterally in a matrix fashion, and, furthermore, lengthwise wiring routes can be selected only on the first wiring layer, lateral wiring lines can be selected only on the second wiring layer, and connections between the lines of the first and second wiring layers can be accomplished by means of through holes.

As a logic gate of the above-mentioned semiconductor device, a basic logic element, for example, a four-input NAND element, can be used, and by combining a plurality of such elements, various kinds of logic circuits usually required can be constructed. The basic element is formed as a basic cell on the semiconductor chip. For example, an AND gate can be constructed by using two basic cells, and a flip-flop circuit can be constructed by using six basic cells. Such a logic circuit which is constructed by using a plurality of basic cells which has one logic function such as AND, flip-flop, NOR, or EXCLUSIVE OR is called a macro-cell. Each macro-cell can be considered to be one element by itself, and, for example, when a flip-flop circuit is necessary for forming a logic circuit, a previously prepared macro-cell having the logic function of a flip-flop circuit may be used to form a logic circuit by forming it on the semiconductor chip as a combination of basic cells by means of a predetermined construction method.

Conventionally, when a macro-cell is constructed by means of the above-mentioned gate array method, the smallest number of basic cells necessary for the formation of the macro-cell are used. However, in the above-mentioned conventional method, there is a problem in that the density of the occupied terminals becomes so high that the computer may not discover the required wiring routes and thus the number of unconnected wiring routes may be increased. Furthermore, even if the wiring routes are discovered, these routes may be very long because they are roundabout routes on the macro-cell. When the required wiring routes are not discovered by the computer and remain unconnected, it is necessary to connect them by hand, which is troublesome and results in mis-connection and inequality. Also, when a wiring route is very long, signal transmitting time is delayed and the stray capacitance of the wiring is increased.

SUMMARY OF THE INVENTION

An object of the present invention is to solve the above-mentioned problems of the prior art and to provide a semiconductor device having a gate array structure in which the density of the occupied terminals of a macro-cell is not high so that the wiring routes across the macro-cell can be readily discovered.

In accordance with the present invention, there is provided a semiconductor device having a gate array structure, in which a plurality of macro-cells are arranged on a semiconductor chip, each of the macro-cells including a plurality of basic cells and having a logic function. The plurality of macro-cells includes more basic cells than the basic cells which perform the logic function by connecting each other, whereby the density of occupied terminals in a direction vertical to the direction in which wiring lines can be drawn, is decreased.

DESCRIPTION OF THE PREFERRED EMBODIMENTS

The embodiments of the present invention are described in detail in comparison with conventional macro-cells with reference to the accompanying drawings.

Figure 2:
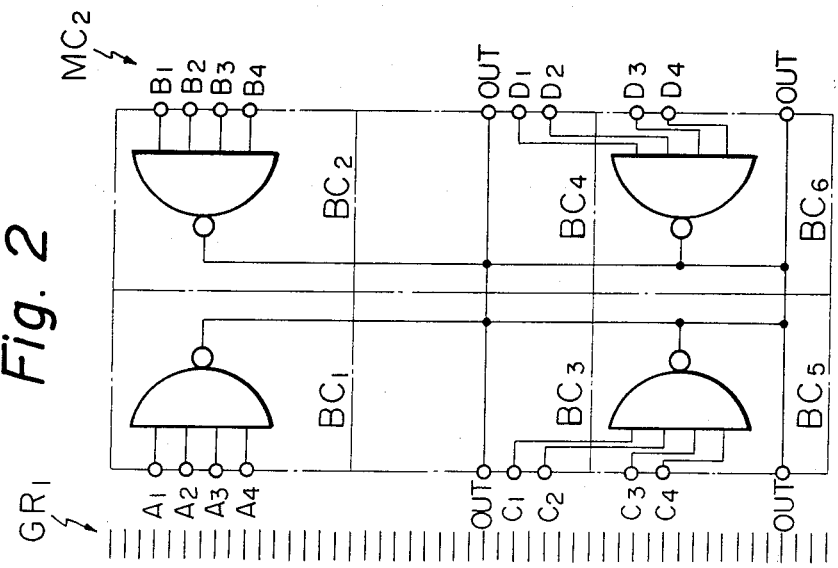
FIG. 2 is a structure of a macro-cell-forming a 4 wide-4 input AND-OR inverter according to the present invention.
Figure 1:
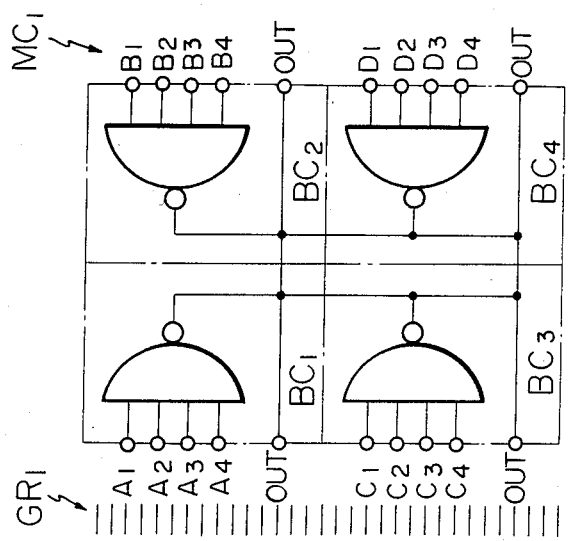
FIG. 1 is a structure of a macro-cell-forming a 4 wide-4 input AND-OR inverter which is constructed by means of a conventional method.

FIGS. 1 and 2 are structures of macro-cells having a logic function of a 4 wide-4 input AND-OR inverter according to the prior art and the present invention, respectively.

Macro-cell $MC_1$ of FIG. 1 is constructed by using four adjacent basic cells $BC_1$ through $BC_4$. Each basic cell has one 4-input NAND gate, and, therefore, at least four basic cells are necessary for constructing the macro-cell of a 4 wide-4 input AND-OR inverter. Terminals $A_1$ through $A_4$ are inputs of the NAND gate of basic cell $BC_1$, terminals $B_1$ through $B_4$ are inputs of the NAND gate of basic cell $BC_2$, terminals $C_1$ through $C_4$ are inputs of the NAND gate of basic cell $BC_3$, and terminals $D_1$ through $D_4$ are inputs of the NAND gate of basic cell $BC_4$. Terminals OUT are output terminals of each basic cell and are connected to each other. In the semiconductor chip on which the macro-cell $MC_1$ is formed, a large number of basic cells are arranged in a matrix fashion. On the basic cells two wiring layers are formed, one which is provided for the lengthwise wiring lines and the other which is provided for the lateral wiring lines. On these wiring layers, a wiring line can be drawn only on a predetermined grid, and lengthwise and lateral wiring lines can be connected by means of a through hole. In FIG. 1, the pitch of the above-mentioned grid is shown as $GR_1$. As can be seen from the figure, the density of the terminals in the lengthwise direction of macro-cell $MC_1$ is so high that the lateral line passing through macro-cell $MC_1$ may not be drawn on grid GR$_1$. In such a case, the wiring route must run around macro-cell MC$_1$, with the result that the length of the wiring line is increased.

Macro-cell MC$_2$ of FIG. 2 according to the present invention is constructed by using six basic cells BC$_1$ through BC$_6$, that is by using two more basic cells than were used to construct MC$_1$ of FIG. 1. Like macro-cell MC$_1$, macro-cell MC$_2$ forms a 4 wide-4 input AND-OR inverter. In macro-cell MC$_2$, the NAND gates of basic cells BC$_1$, BC$_2$, BC$_5$ and BC$_6$ are used. All four terminals of basic cells BC$_1$ and BC$_2$ and three terminals of basic cells BC$_3$, BC$_4$, BC$_5$ and BC$_6$ are used. Thus, in macro-cell MC$_2$ of FIG. 2, the density of the terminals in the lengthwise direction is substantially lower than that in macro-cell MC$_1$ of FIG. 1. Accordingly, the freedom of selection of the wiring route passing across macro-cell MC$_2$ is increased, and, therefore, design of the wiring pattern becomes easier.

Figure 3:
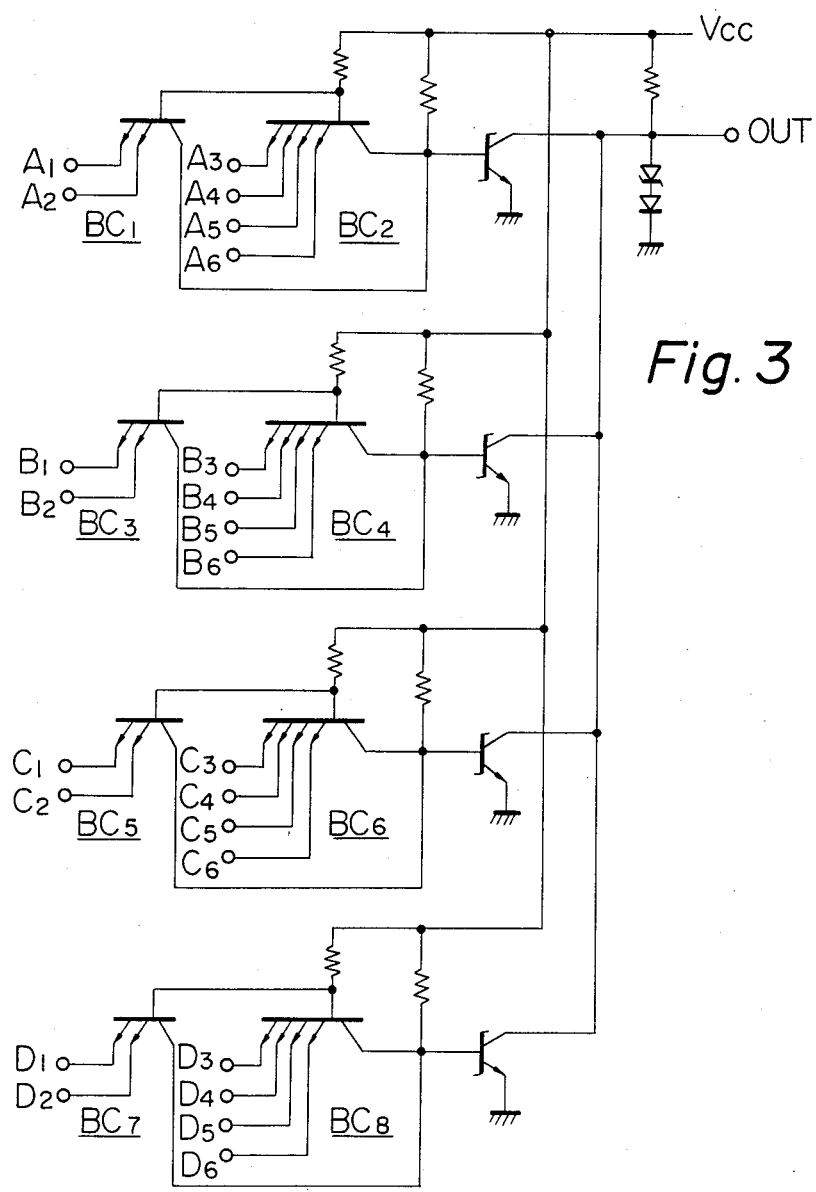
FIG. 3 is a circuit diagram of a macro-cell of a 4 wide-6 input AND-OR inverter.
Figure 4:
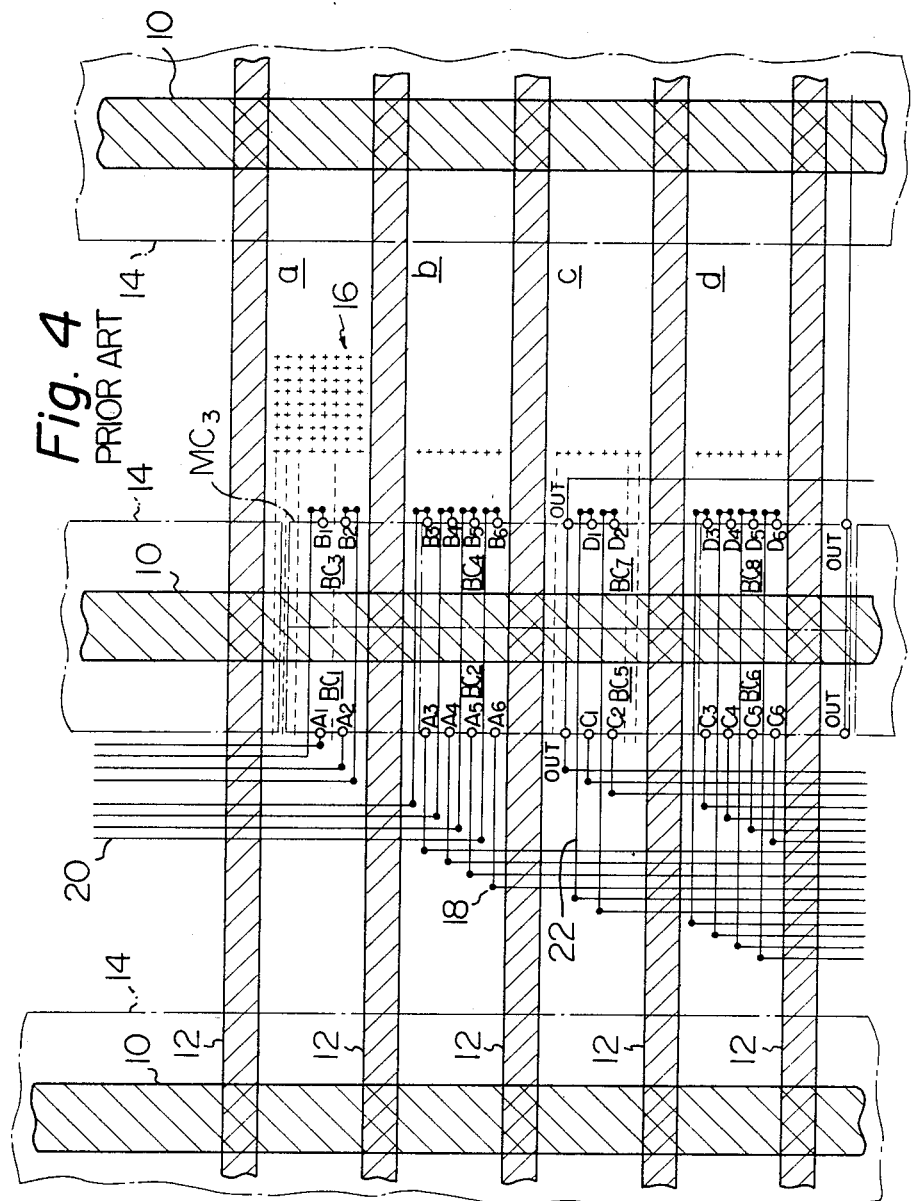
FIG. 4 is a structure of the macro-cell of FIG. 3 constructed by means of a conventional method.
Figure 5:
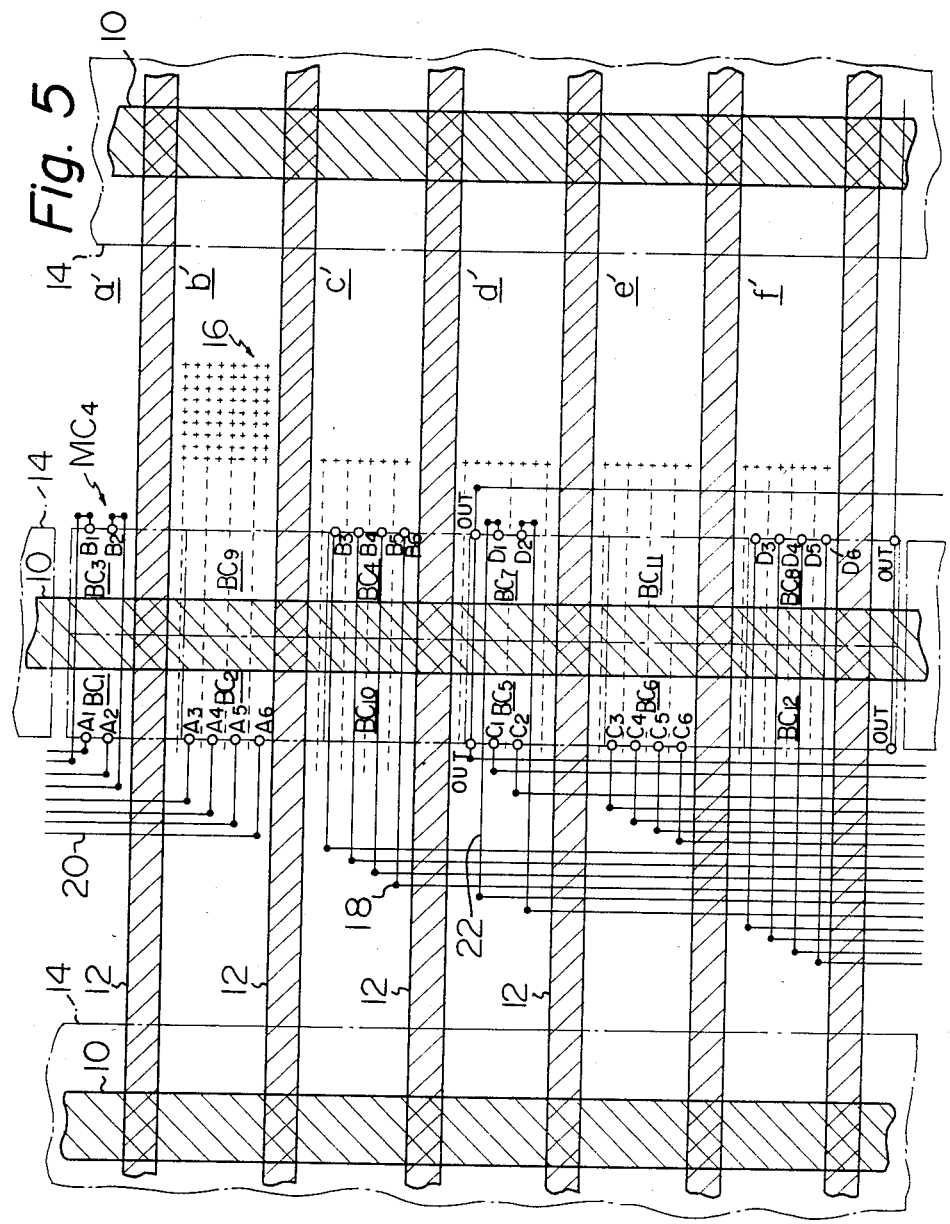
FIG. 5 is a structure of the macro-cell of FIG. 3 according to the present invention.

Another embodiment of the present invention is described with reference to FIGS. 3, 4, 5 and 6. FIG. 3 is a circuit diagram of a 4 wide-6 input AND-OR inverter. FIG. 4 is the structure of a macro-cell having the logic function of a 4 wide-6 input AND-OR inverter which is constructed by means of a conventional method. FIG. 5 is the structure of a macro-cell having the logic function of a 4 wide-6 input AND-OR inverter which is constructed according to the present invention.

The 4 wide-6 input AND-OR inverter of FIG. 3 can be constructed by using eight basic cells, each of which has one 4-input NAND gate. Macro-cell MC$_3$ of FIG. 4 is constructed by using eight basic cells BC$_1$ through BC$_8$, the minimum number necessary for constructing the 4 wide-6 input AND-OR inverter. In FIG. 4, two rows of basic cells are arranged in the lengthwise direction. Along the rows of basic cells, a lengthwise pattern of a voltage supply line 10 is formed in the first wiring line layer, and lateral patterns of ground wiring line 12 are formed in the second wiring layer. Voltage supply lines 10 are arranged in parallel with each other, as are ground wiring lines 12. Basic cell arrays 14 are arranged along voltage supply lines 10. Lengthwise wiring lines 20 can be drawn between adjacent voltage supply lines 10 and lateral wiring lines 22 can be drawn between adjacent ground wiring lines 12. Wiring lines 20 and 22 can be drawn on grid pattern 16, and one of the lengthwise wiring lines 20 and one of the lateral wiring lines 22 can be connected via through hole 18.

In macro-cell MC$_3$ of FIG. 4, the desity of the terminals is very high, and most of the wiring routes in the lateral wiring areas a, b, c and d are used for leading out the terminals of macro-cell MC$_3$. Thus, the number of lateral wiring routes which can be used to pass through macro-cell MC$_3$ is 4 in area a, o in area b, 3 in area c, and 0 in area d, as shown by the broken lines.

On the other hand, macro-cell MC$_4$ of FIG. 5 is constructed by using 12 basic cells BC$_1$ through BC$_{12}$, including 4 extra basic cells BC$_9$ through BC$_{12}$. In macro-cell MC$_4$, the formation of two terminals on the same lateral wiring route on both sides of macro-cell MC$_4$ is avoided as much as possible, and the terminals in lateral wiring areas a', b', c', d', e' and f' are distributed as evenly as possible. Thus, the density of the terminals in the lengthwise direction can be decreased. The number of lateral wiring routes which can be used to pass through macro-cell MC$_4$ is 4 in area a', 4 in area b', 4 in area c', 3 in area d', 4 in area e', and 4 in area f', as shown by broken lines. Thus, in macro-cell MC$_4$, an unused lateral wiring route passing through macro-cell MC$_4$ can be found in all of wiring areas a' through f'.

Figure 6:
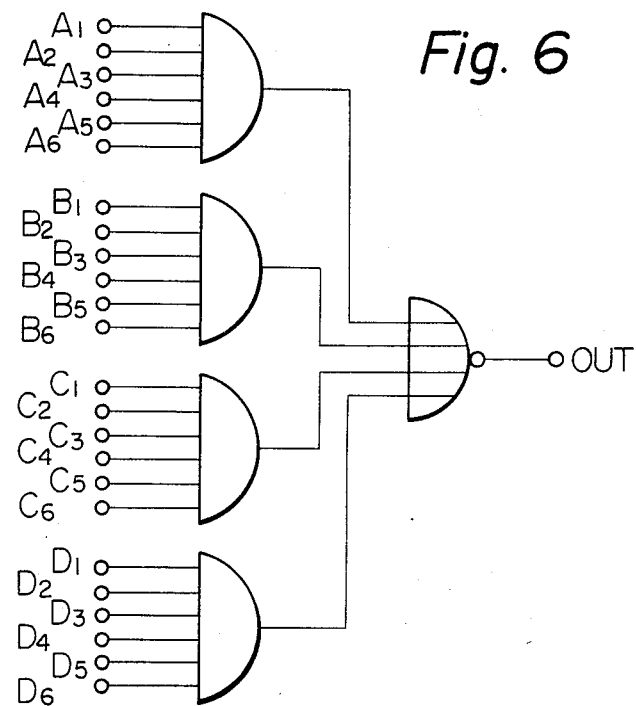
FIG. 6 is a logic diagram of the macro-cell of FIG. 3.
Figure 7:
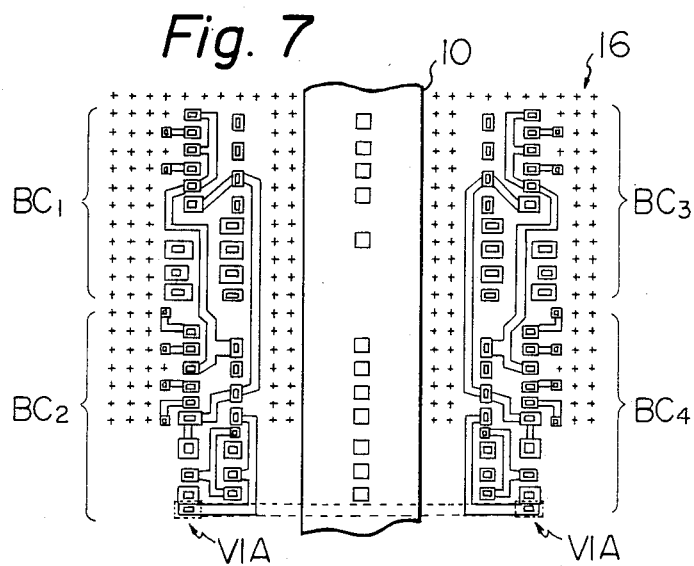
FIG. 7 is a schematic plan view of the basic cells formed on the semiconductor chip.

The logic diagram of the macro-cell MC$_4$ of FIG. 5 is illustrated in FIG. 6. An example of a plan view of the actual wiring pattern of a macro-cell is illustrated in FIG. 7.

As described above, according to the present invention, in a semiconductor device having a gate array structure, by constructing a macro-cell by using more than the necessary number of basic cells, the density of the terminals can be decreased and thus the design work for determining the desired wiring routes can be made easier. In addition, the wiring pattern can be drawn by a digital computer so that there are no unconnected wiring routes, and the quality of the wiring pattern can be improved.

We claim:

1. A semiconductor device having a gate array structure, wiring channels, and wiring lines, comprising:
   macro-cells formed on a semiconductor chip, each of said macro-cells comprising:
   basic cells having terminals and performing a logic function; and
   at least one of said macro-cells comprising more than a minimum number of said basic cells necessary to perform the logic function to be realized by said at least one of said macro-cells, thereby decreasing the ratio between the number of terminals in said at least one of said macro-cells and the number of wiring channels across said at least one of said macro-cells, on and along which the wiring lines are distributed.

2. A logic circuit formed using a gate array structure, comprising:
   a macro-cell, including:
   basic cells operatively connected to form said macro-cell, the number of said basic cells being greater than a minimum number of said basic cells necessary to form the logic circuit realized by said macro-cell; and
   lateral wiring routes passing through said macro-cell over each of said basic cells.

3. A logic circuit as set forth in claim 2, wherein there is at least one unused lateral wiring route passing through each said basic cell of said macro-cell.

* * * * *